United States Patent
Christol et al.

(10) Patent No.: US 7,738,264 B2
(45) Date of Patent: Jun. 15, 2010

(54) DEVICES AND METHODS FOR PROTECTING HANDHELD ELECTRONIC DEVICES FROM ELECTROSTATIC DISCHARGE

(75) Inventors: Jim Christol, Cupertino, CA (US); Wayne Kvenvold, Sunnyvale, CA (US); Joseph A. McCluskey, Sharon, MA (US); Enrico Tresoldi, Carugate (IT)

(73) Assignee: Lifescan Scotland Ltd., Scotland (GB)

( * ) Notice: Subject to any disclaimer, the term of this patent is extended or adjusted under 35 U.S.C. 154(b) by 937 days.

(21) Appl. No.: 11/395,025

(22) Filed: Mar. 31, 2006

(65) Prior Publication Data

US 2007/0230155 A1    Oct. 4, 2007

(51) Int. Cl.
 *H05K 9/00* (2006.01)
(52) U.S. Cl. .................. 361/818; 361/753; 361/799; 361/800; 361/816; 174/350; 174/377
(58) Field of Classification Search .................. 361/730, 361/752, 753, 799, 800, 816, 818; 174/350, 174/377
See application file for complete search history.

(56) References Cited

U.S. PATENT DOCUMENTS

| | | | |
|---|---|---|---|
| 5,124,889 A * | 6/1992 | Humbert et al. ............. 361/818 |
| 5,235,492 A * | 8/1993 | Humbert et al. ............. 361/818 |
| 5,383,097 A | 1/1995 | DeLucia et al. |
| 5,418,693 A | 5/1995 | Perry |
| 5,673,181 A * | 9/1997 | Hsu ............................ 361/760 |
| 5,682,299 A * | 10/1997 | Kunert ........................ 361/816 |
| 5,708,247 A | 1/1998 | McAleer et al. |
| 5,782,370 A | 7/1998 | Kamiya |
| 5,818,101 A | 10/1998 | Schuster |
| 5,825,606 A | 10/1998 | Villain et al. |
| 6,046,051 A | 4/2000 | Jina |
| 6,088,231 A * | 7/2000 | Fajardo ....................... 361/737 |
| 6,166,324 A * | 12/2000 | Oldendorf et al. ........... 174/377 |
| 6,241,537 B1 | 6/2001 | Tate et al. |
| 6,532,152 B1 | 3/2003 | White et al. |
| 6,674,652 B2 * | 1/2004 | Forte et al. .................. 361/800 |
| 6,784,363 B2 | 8/2004 | Jones |
| 6,816,384 B2 * | 11/2004 | Wu et al. ..................... 361/759 |
| 6,858,794 B2 | 2/2005 | Jensen et al. |
| 6,859,351 B2 | 2/2005 | Byrne et al. |
| 7,239,519 B2 * | 7/2007 | Guo et al. .................... 361/714 |
| 2004/0007834 A1 | 1/2004 | Kohler et al. |
| 2004/0057218 A1 | 3/2004 | Wu et al. |

FOREIGN PATENT DOCUMENTS

| EP | 0 503 184 | | 4/1995 |
|---|---|---|---|
| JP | 05145262 | * | 6/1993 |
| WO | WO 01/67099 | | 9/2001 |
| WO | WO 01/73124 | | 10/2001 |

* cited by examiner

*Primary Examiner*—Dameon E Levi (57) ABSTRACT

The present invention provides methods and devices for protecting electronic components of handheld electronic devices from electrostatic discharge. An electronic device in accordance with the present invention includes an enclosure having first and second housing portions, a mating edge connection between the first and second housing portions, an electronic component, and an electrically insulating frame. The electrically insulating frame is positioned within the enclosure and surrounds at least a portion of the electronic component thus providing an electrostatic discharge barrier between the mating edge connection and the electronic component.

7 Claims, 10 Drawing Sheets

DEVICES AND METHODS FOR PROTECTING HANDHELD ELECTRONIC DEVICES FROM ELECTROSTATIC DISCHARGE

TECHNICAL FIELD

The present invention relates to devices and methods for protecting sensitive electronic components from electrostatic discharge. More particularly, the present invention relates to devices and methods for protecting electronic components of handheld electronic devices from electrostatic discharge.

BACKGROUND

Portable electronic devices are popular tools for both business and personal activities. The smallest and lightest of these devices are suitable for and most often carried and operated while being held in the hand of its user. Typical handheld electronic devices include cellular phones, personal digital assistants, cameras, as well as medical devices such as analyte measurement devices.

A typical handheld electronic device usually includes a circuit board and user display. Both the circuit board and display are assembled into or otherwise integrated with a housing. In order to allow the circuit board and display to be easily positioned inside the housing, conventionally, the housing is divided into an upper housing and a lower housing. The display is typically supported by the upper housing and the circuit board is usually supported by the lower housing although various other configurations are utilized. The upper and lower housing are assembled to form the housing and because of this structure, there is a mating seam between the upper and lower housing.

In handheld devices, especially those with plastic cases, electrostatic discharge is a particular concern. To avoid such disruptions, many devices contain some form of electrostatic discharge protection. Handling the device, sliding it along a table, or simply picking it up for use can generate electrostatic voltages of 25 kilovolts or more. While each discharge is extremely short in duration, such high voltages can cause disruptions to electronic devices such as loss of memory, device reset, or even physical damage that results in fusing or rupture of device components. Even though the case itself generally has a high electrical strength, there are leakage zones particularly along housing seams or where a lid or cover that provides access to internal electronics is fitted onto the main housing. Electrostatic discharge can disrupt or damage a handheld electronic device when a user touches or handles the device in a way that causes a spark to traverses from the user at or near an opening in the handheld device such as at a seam in the housing or the like. When a spark occurs at or near such an opening the spark can pass through the opening and reach an electronic component such as a circuit board or the like. Accordingly, care must be taken to prevent electrostatic discharge from reaching and damaging, interrupting, or otherwise affecting sensitive electronic components.

SUMMARY

In accordance with an aspect of the present invention, a housing system for protecting an electronic component of a handheld electronic device against electrostatic discharge is provided. The handheld electronic device may comprise an analyte measurement device such as for measuring blood glucose or the like. The housing preferably comprises first and second housing portions, a mating edge connection between the first and second housing portions, and an electrically insulating barrier or wall. The first and second housing portions at least partially define an enclosure for the electronic component of the electronic device. The mating edge connection preferably comprises an overlapping seam between the first and second housing portions. The electrically insulating barrier is preferably distinct from the first and second housing portions and preferably comprises a frame or the like. When the electronic component of the electronic device is positioned in the enclosure, the insulating wall is preferably positioned between the mating edge connection and the electronic component of the electronic device.

In another aspect of the present invention, a handheld electronic device is provided. The electronic device preferably comprises first and second housing portions, a mating edge connection between the first and second housing portions, an electronic component, and an electrically insulating frame. The first and second housing portions at least partially define an enclosure and the electronic component is positioned, at least partially, within the enclosure. The electrically insulating frame is also positioned within the enclosure and surrounds at least a portion of the electronic component. The electrically insulating frame is positioned to provide an electrostatic discharge barrier between the mating edge connection and the electronic component.

In yet another aspect of the present invention, a method of protecting an electronic component of a handheld electronic device from electrostatic discharge is provided. The method preferably comprises the steps of surrounding at least a portion of the electronic component with an insulating frame, at least partially enclosing the electronic component and frame within a housing comprising first and second housing portions and a mating edge connection between the first and second housing portions, and positioning the frame adjacent to the mating edge connection to provide an electrostatic discharge barrier between the mating edge connection and the electronic component.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
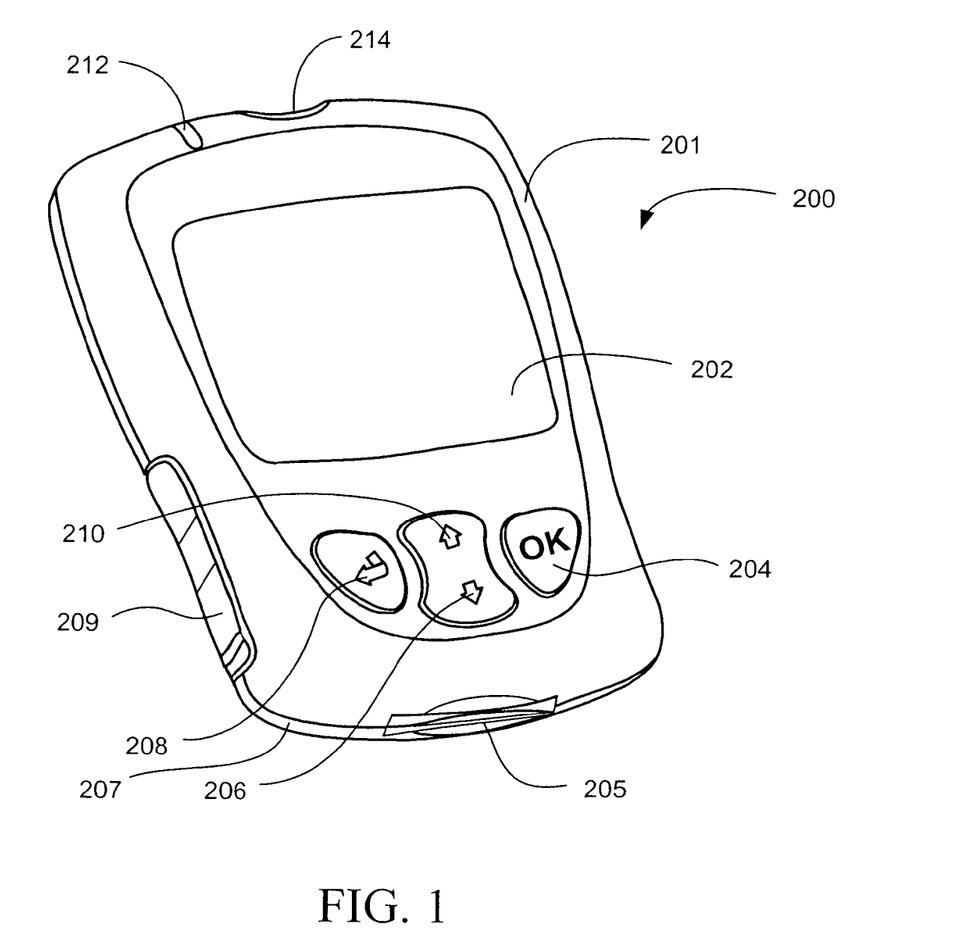
FIG. 1 is a perspective view of an exemplary handheld electronic device protected against electrostatic discharge in accordance with the present invention.
Figure 2:
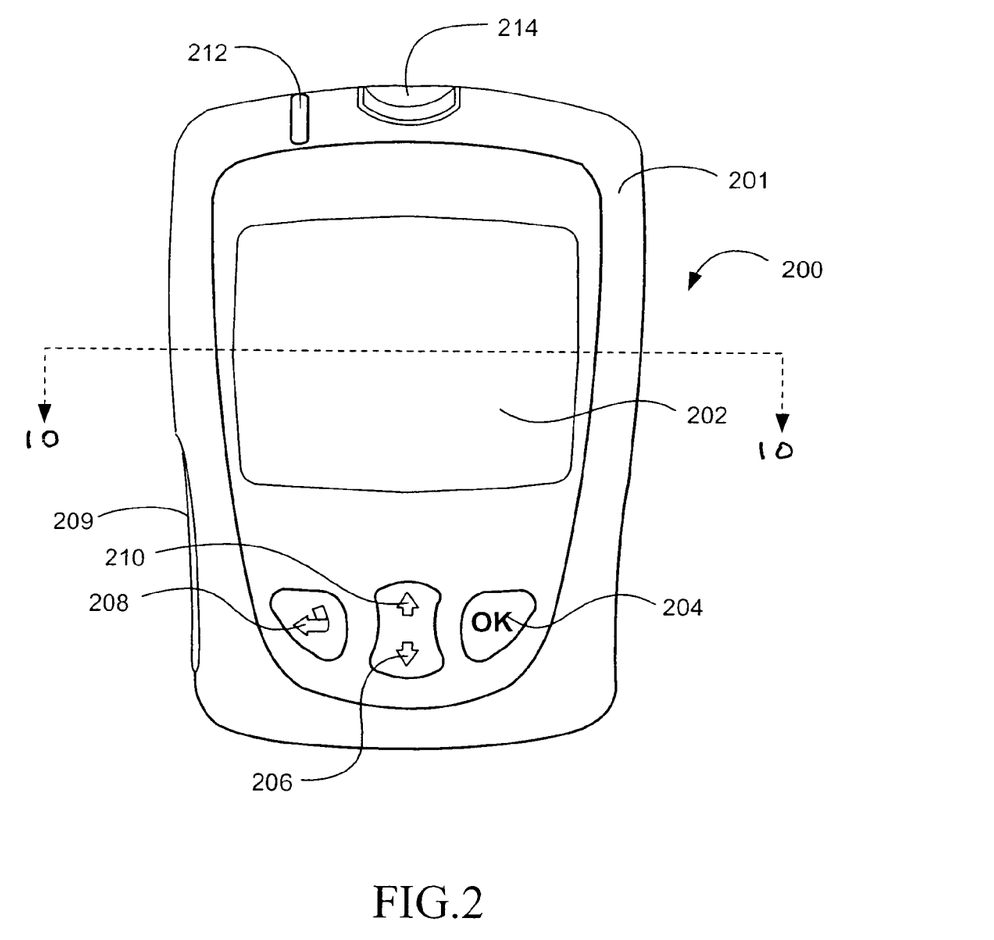
FIG. 2 is a plan view of the handheld electronic device of FIG. 1.

FIGS. 1 and 2 are a perspective view and plan view, respectively, of an exemplary handheld electronic device 200 that encloses electronic components that are protected against electrostatic discharge in accordance with the present invention. As illustrated, handheld electronic device 200 is a handheld glucose meter but any electronic device, handheld or otherwise, can be protected against electrostatic discharge in accordance with the present invention. Handheld electronic device 200 includes a first housing portion 201, a display 202, an OK button 204, a universal port connector 205, a down button 206, a second housing portion 207, a back button 208, a port cover 209, an up button 210, light emitting diode 212, and a strip port connector 214. As shown, first housing portion 201 and second housing portion 207 provide the outer structure of an ergonomically shaped handheld glucose meter that preferably incorporates the functional circuitry required for measuring glucose episodically and may include additional functional circuitry such as for wirelessly communicating with an insulin pump or the like.

Figure 3:
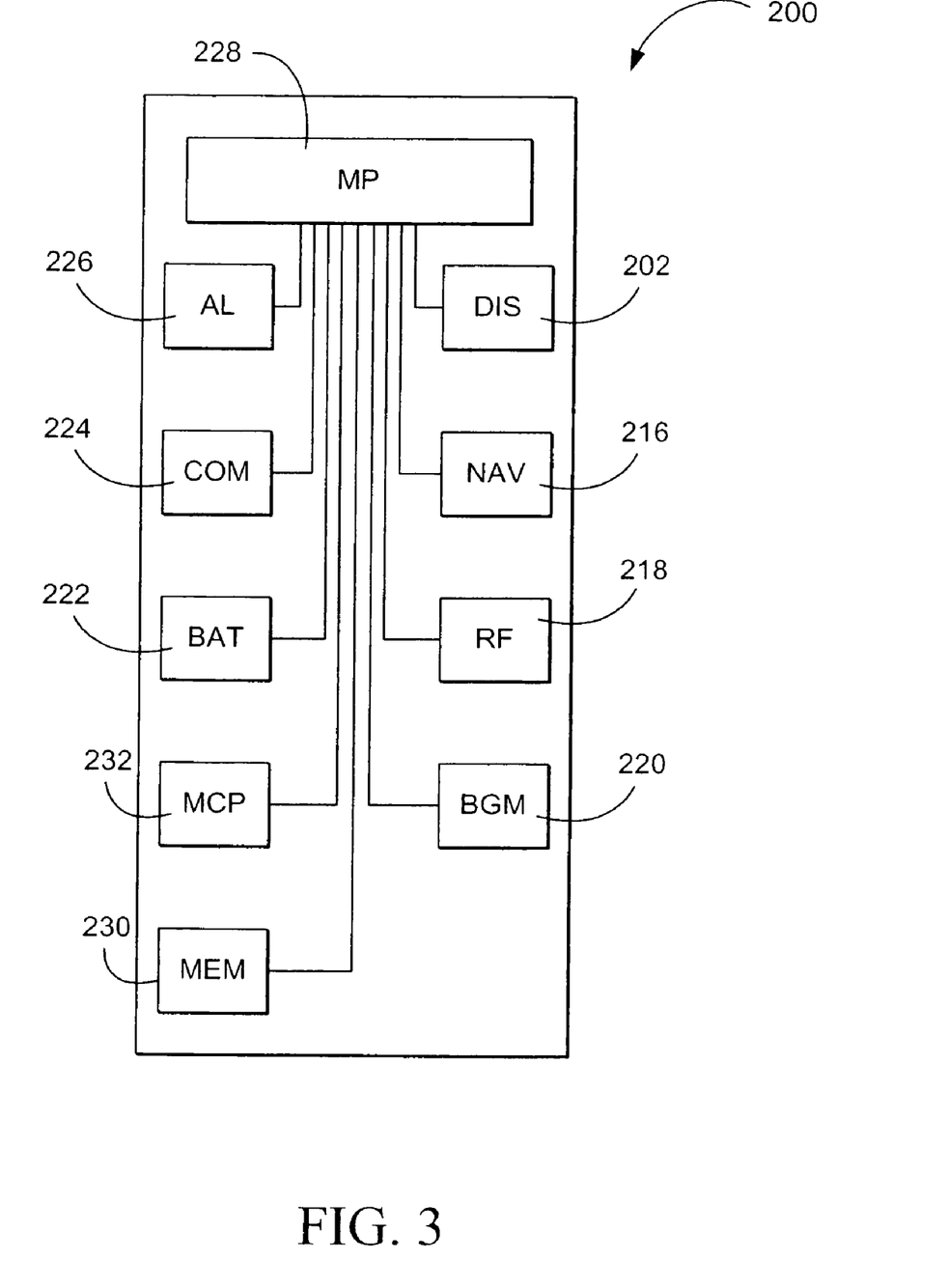
FIG. 3 is a schematic diagram illustrating certain components of the handheld electronic device of FIGS. 1 and 2.

Handheld electronic device 200 generally comprises plural electronic components as shown in the schematic diagram of FIG. 3. Such electronic components are exemplary and depend on the particular handheld electronic device. For the handheld electronic device 200, such components preferably include a display (DIS) 202, navigational buttons (NAV) 216, a radio frequency module (RF) 218, a blood glucose measurement (BGM) module 220, a battery (BAT) 222, a wired communication port (COM) 224, an alarm (AL) 226, a microprocessor (MP) 228, a memory portion (MEM) 230, and a memory chip port (MCP) 232. Typically, such electronic components are provided as mounted to one or more printed circuit boards or the like such as a motherboard or daughterboard but may be provided distinct from a circuit board.

Typically, for the illustrated handheld electronic device 200, all of the electronic components are mounted to a motherboard except radio frequency module 218, which is usually mounted to a daughter board. If used, the daughter board is preferably attached to the motherboard. Radio frequency module 218 may include an antenna, an impedance matching network, a radio frequency microprocessor or the like.

Preferably, port cover 209 comprises an elastomeric material that covers a wired connection port and a memory chip port. Examples of a wired connection port include a universal serial bus or RS 232 port. Examples of memory suitable for use with memory receiving port include a flash memory such as a SIMM card, a SmartCard, Smart Media, and the like.

Display 202 preferably comprises a liquid crystal display to show both textual and graphical information to a user. A preferred user interface comprises a software driven menu that is viewable on display 202 and that enables the user to operate handheld electronic device 200. A user can navigate through the user interface, preferably using navigation buttons 216 such as up button 210, down button 206, OK button 204, and back button 208. The user interface preferably allows a user to perform functions such as operate an insulin pump, query the status of the insulin pump, measure glucose episodically, and to display data on display 202 (e.g. glucose concentration versus time).

Figure 4:
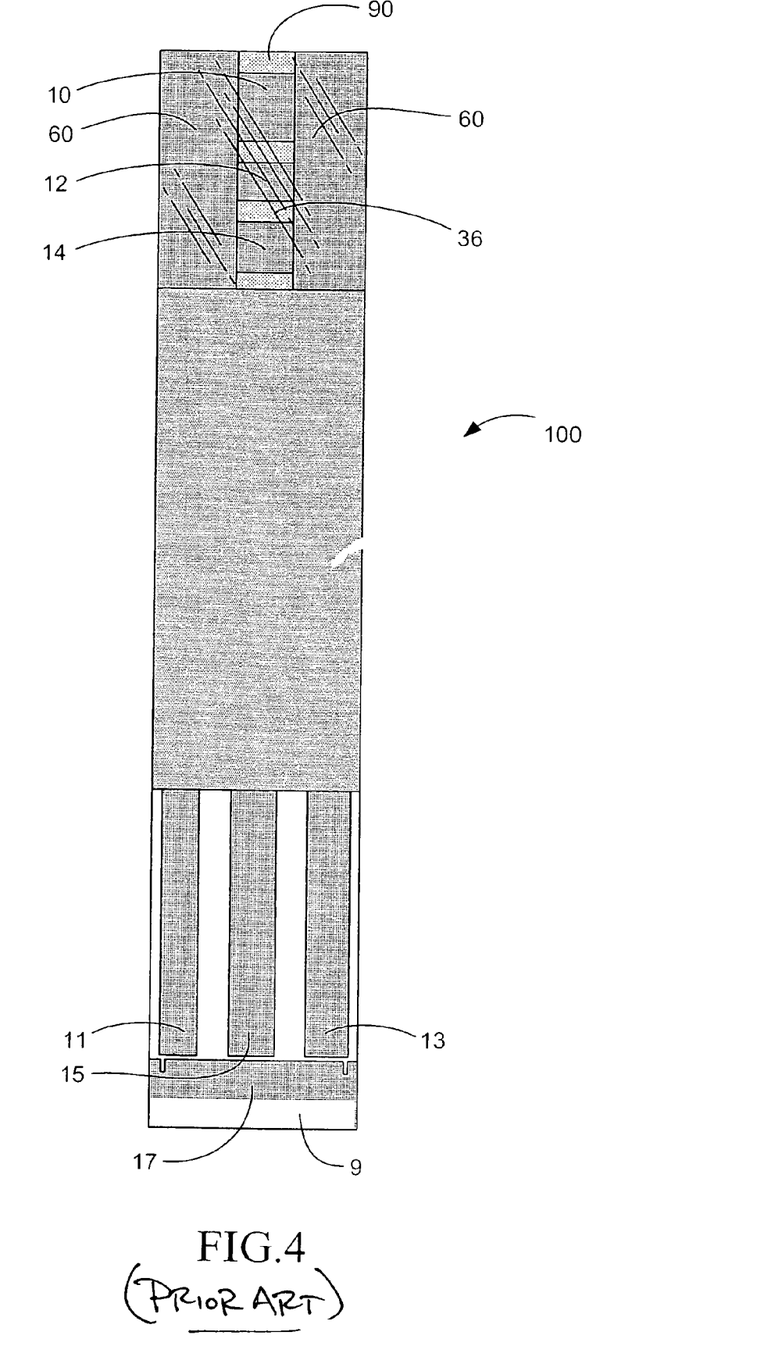
FIG. 4 is a plan view of an exemplary test strip that can be used with the handheld electronic device of FIGS. 1 and 2.

The exemplary handheld electronic device 200, a glucose meter as shown, preferably measures glucose episodically with disposable test strips. An exemplary test strip 100 suitable for use with handheld electronic device 200 is shown in FIG. 4. Test strip 100, as shown, includes a conductive layer printed onto a substrate 9. The conductive layer includes a first contact 13, a second contact 15, a reference contact 11, and a strip detection bar 17 which may be used to electrically connect to strip port connector 214. The conductive layer further includes a first working electrode 12, a second working electrode 14, and a reference electrode 10 which are electrically connected, respectively, to first contact 13, second contact 15, and reference contact 11. Test strip further includes a clear hydrophilic film 36 which is bound by an adhesive 60 that forms a sample receiving chamber that allows blood to be dosed at inlet 90. Such test strips are well known and an example of a test strip suitable for use with the illustrated electronic device 200 is the commercially available OneTouch Ultra test strip from LifeScan, Inc. in Milpitas, Calif., U.S.A.

A reagent layer (not shown) is provided on first working electrode 12, second working electrode 14, and reference electrode 10. Reagent layer may include chemicals such as a redox enzyme and mediator which selectivity reacts with glucose. During this reaction, a proportional amount of a reduced mediator can be enzymatically generated and is measured electrochemically. This allows a current to be measured that is proportional to the glucose concentration. Examples of reagent formulations or inks suitable for use in making the reagent layer can be found in U.S. Pat. Nos. 5,708,247 and 6,046,051 and Published International Applications WO01/67099 and WO01/73124, all of which are fully incorporated by reference herein for all purposes.

Figure 9A:
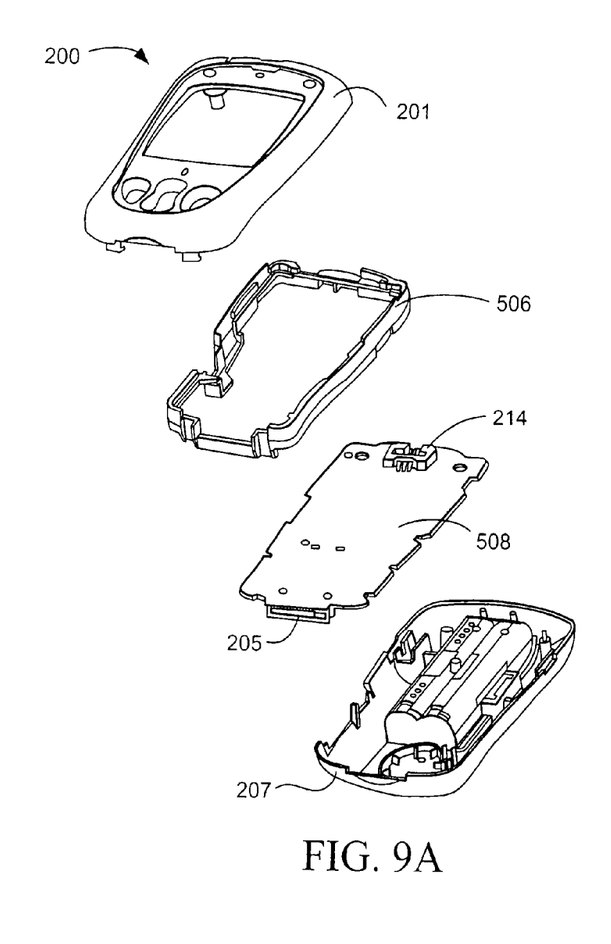
FIG. 9A is a top exploded perspective view of the handheld electronic device of FIGS. 1 and 2.
Figure 9B:
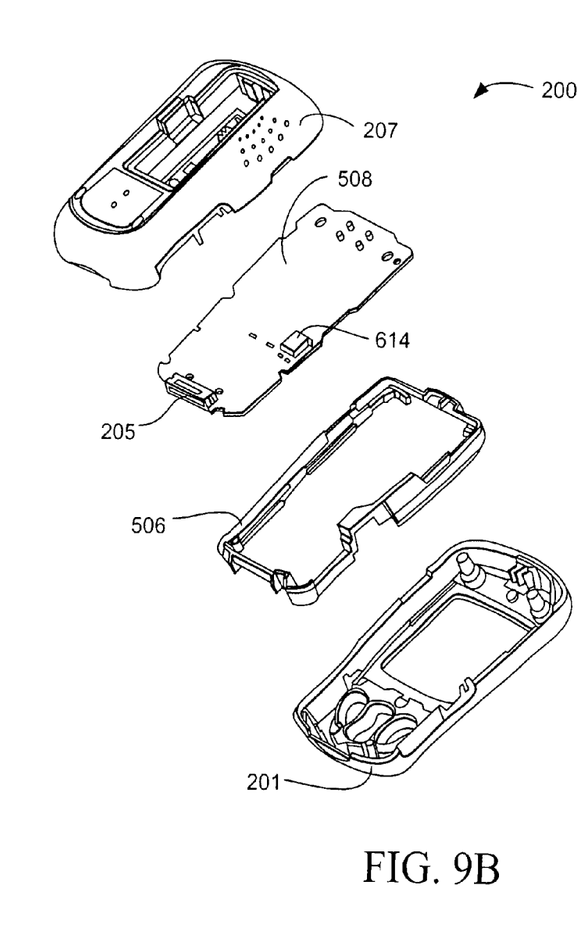
FIG. 9B is a bottom exploded perspective view of the handheld electronic device of FIGS. 1 and 2.

FIGS. 9A and 9B, respectively, show top and bottom exploded perspective views of handheld electronic device 200 showing first housing portion 201, insulating frame 506, circuit board 508, and second housing portion 207. First and second housing portions, 201 and 207 and insulating frame 506, when assembled, provide a housing system that defines an enclosure for the circuit board 508, and other internal components of the electronic device 200 (e.g. display, wiring, additional electronic components separate from the circuit board, or the like). Using two housing portions to form the electronic device 200, as illustrated, is generally preferred as it is efficient and reduces the complexity of the housing particularly for manufacturing. However, an electronic device or housing for an electronic device in accordance with the present invention can have any number of housing portions that are assembled, joined, connected, or otherwise positioned relative to each other. Generally, first housing portion 201 and second housing portion 207 are assembled together using fasteners, a snap fit, or both, or the like, preferably in a removable or semi-permanent manner. First housing portion 201 and second housing portion 207 may be made from thermoplastic materials such as, for example, Bayer Bayblend T85 polycarbonate/ABS blend resin or the like.

Figure 5:
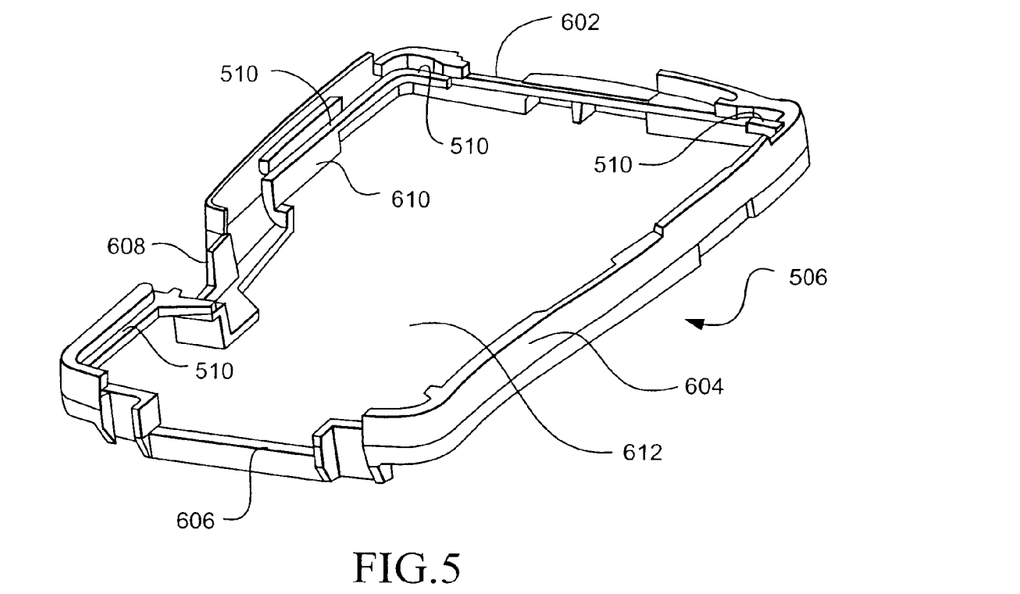
FIG. 5 is a top perspective view of an exemplary insulating frame that can be used to protect one or more electronic components of the handheld electronic device of FIGS. 1 and 2 against electrostatic discharge.
Figure 6:
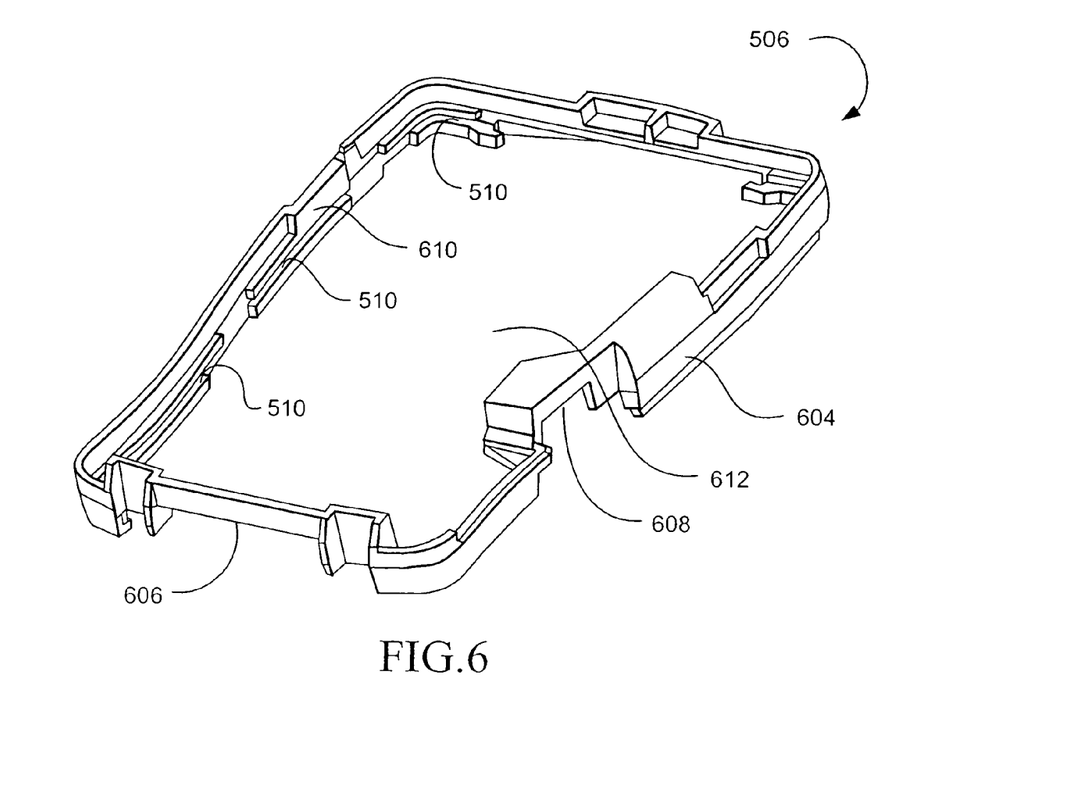
FIG. 6 is a bottom perspective view of the insulating frame of FIG. 5.

FIGS. 5 and 6 show a top perspective view and a bottom perspective view, respectively, of insulating frame 506 for electronic device 200. Insulating frame 506, as shown, includes an outer surface 604, an inner surface 610, and a central region 612 for receiving circuit board 508. Preferably, insulating frame 506 includes inside groove 510 (or similarly functioning feature or structure) for holding circuit board 508. Insulating frame 506 also includes a strip port connector notch 602, a universal port connector notch 606, and a wired communication port notch 608. Strip port connector notch 602, universal port connector notch 606, and wired communication port notch 608 function to provide access to respective electronic components of circuit board 508: strip port connector 214, universal port connector 205, and wired communication port 209.

Insulating frame 506 may be made from a thermoplastic elastomer or thermoset elastomer or the like, for example. An example of a thermoplastic elastomer is Synprene RT-3860M which is commercially available from PolyOne. Insulating frame 506 may be made by a process of injection molding or the like. Insulating frame 506 may also comprise a gasket or ring, flexible for example, formed from an insulating material such as a rubber or other elastomeric material. The insulating material may be non-porous, for example.

Figure 7:
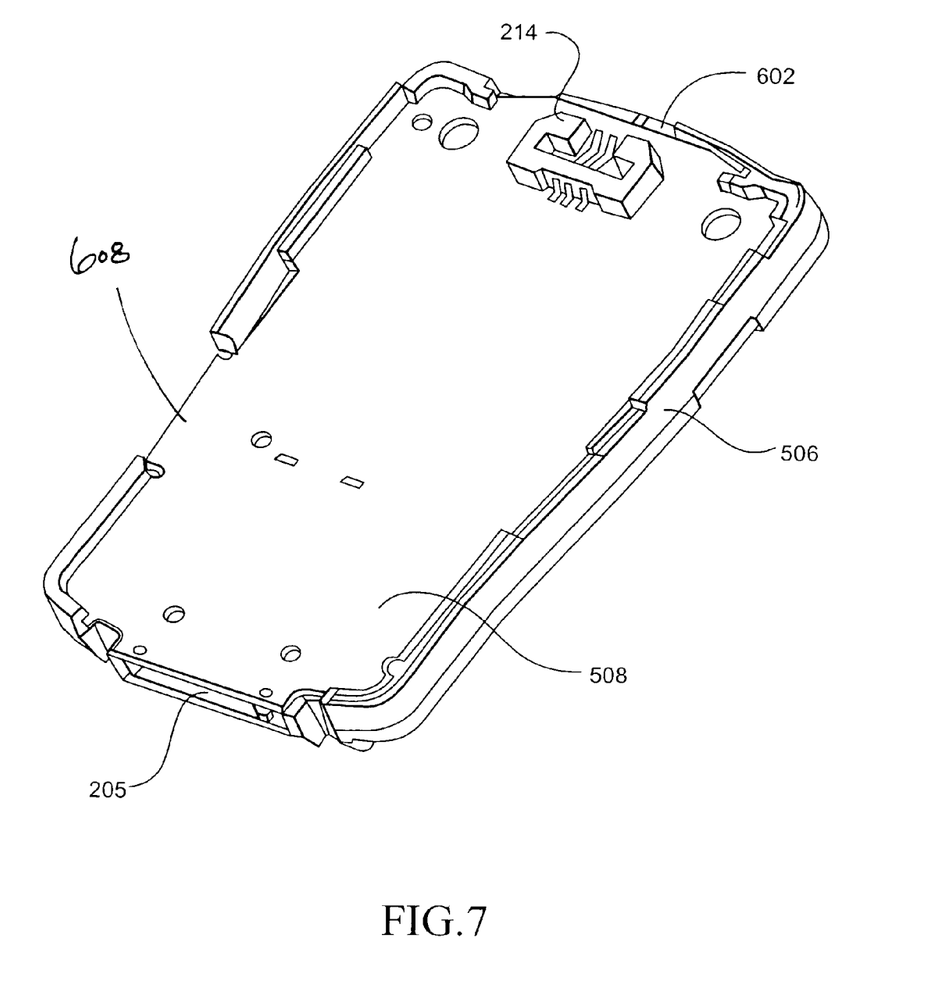
FIG. 7 is a top perspective view of the insulating frame of FIG. 5 including a circuit board positioned in a central region of the insulating frame and held by a slot of the insulating frame.
Figure 8:
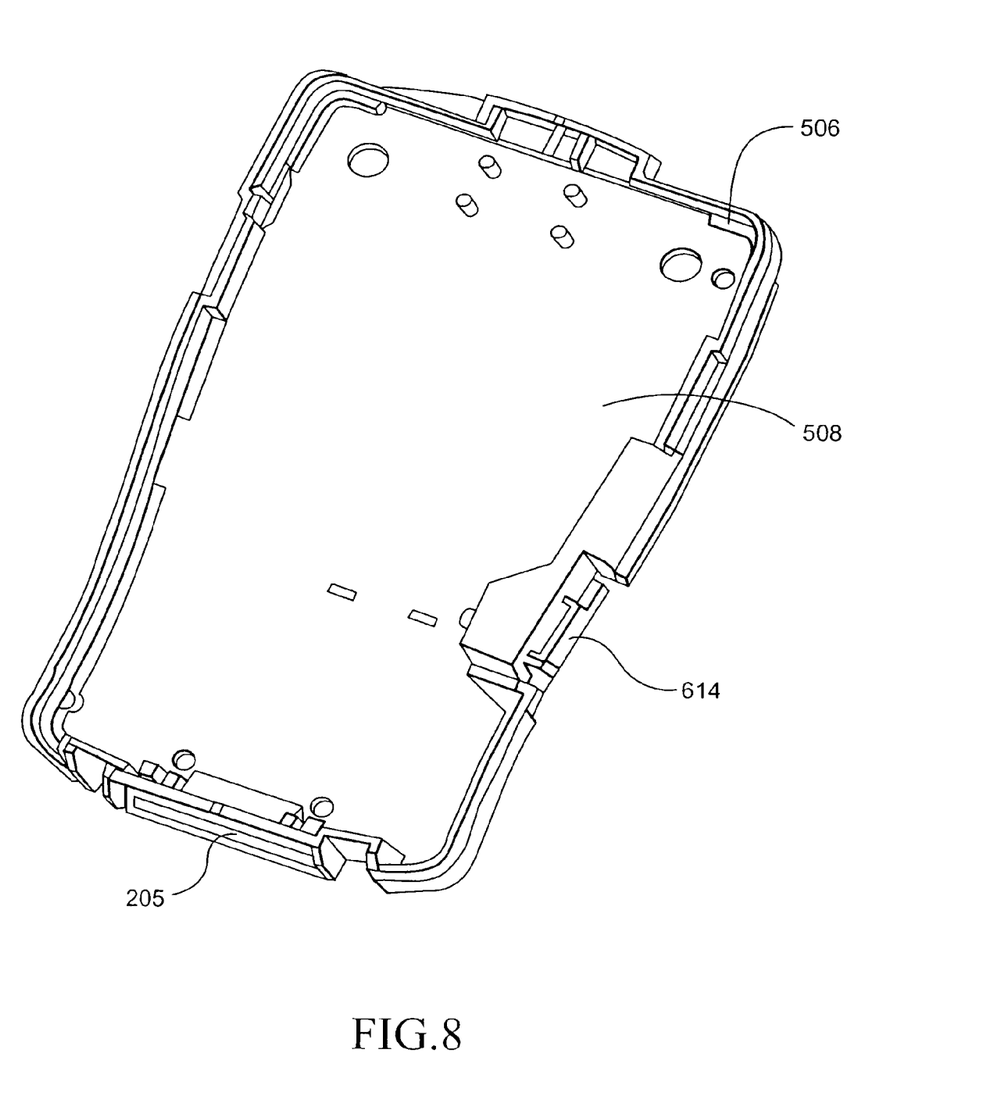
FIG. 8 is a bottom perspective view of the insulating frame and circuit board of FIG. 7.

FIGS. 7 and 8 show insulating frame 506 of FIGS. 5 and 6 with circuit board 508 positioned in central region 612 and held by groove 510. As shown, insulating frame 506 substantially surrounds the periphery of circuit board 508 but can be designed to surround any desired portion of circuit board 508 or other electronic component. Preferably, insulating frame 506 surrounds an electronic component(s) to be protected from electrostatic discharge. Insulating frame 506, as shown, is formed as a monolithic structure but can be formed from any number pieces that are assembled or positioned relative to each other to protect circuit board 508 or other electronic component against electrostatic discharge in accordance with the present invention. Insulating frame 506 is preferably sufficiently flexible or stretchable so that circuit board 508 can be mounted within central region 612. As an example, insulating frame 506 preferably has a flexibility of about 60 Shores.

Figure 10:
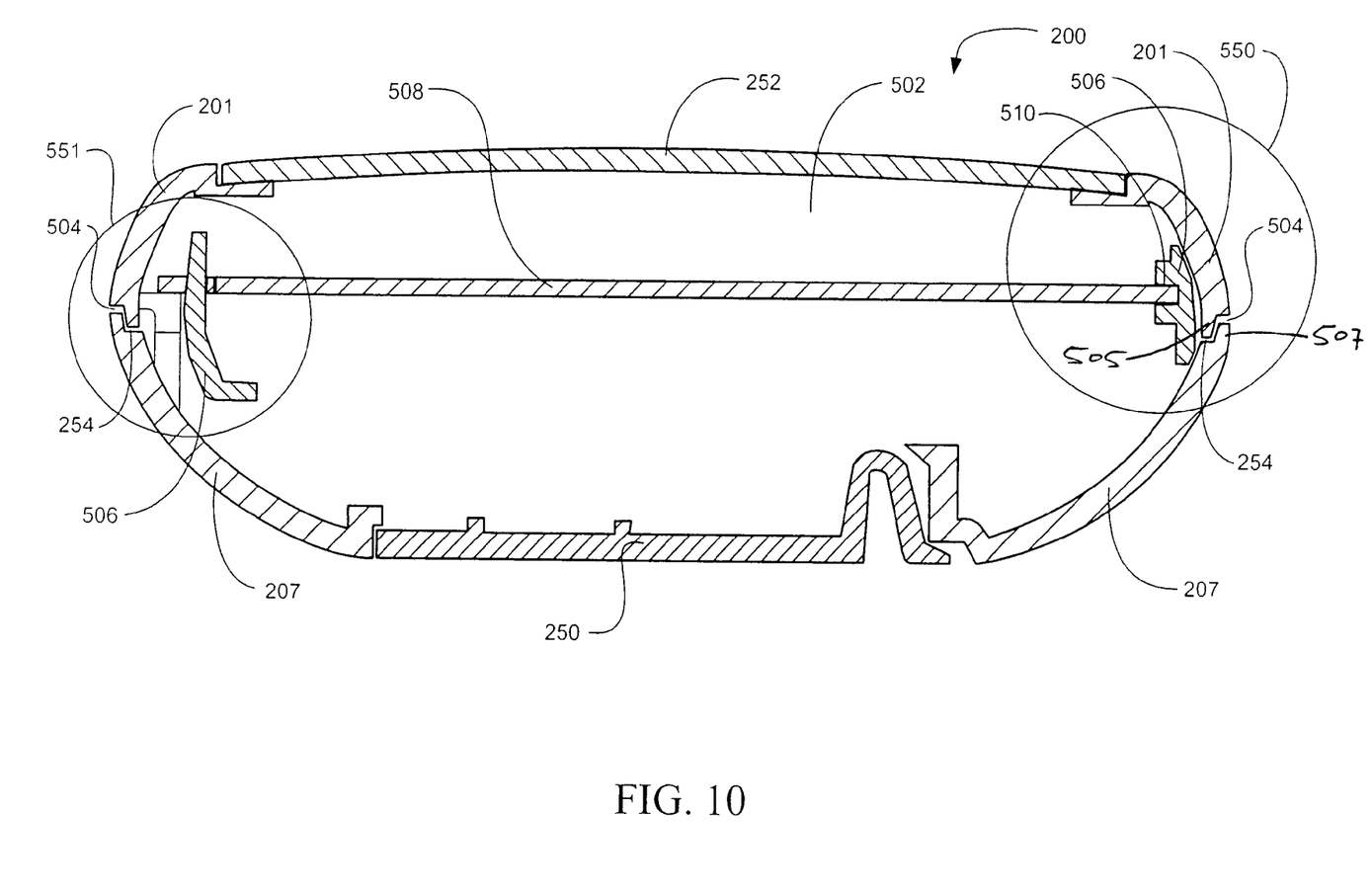
FIG. 10 is a cross-sectional view of the handheld device of FIG. 2 taken along the line 10-10.

Insulating frame 506 is preferably keyed to adapt to first housing portion 201 and second housing portion 207 to hold circuit board 508 within interior space 502 formed by the enclosure created by first housing portion 201 and second housing portion 207 (see FIG. 10). That is, insulating frame 506 preferably includes structure to align one or both of the first and second housing portions 201 and 207.

FIG. 10 shows a partial cross-sectional view of handheld electronic device 200 of FIG. 2 as taken along line 10-10, which shows interior space 502, insulating frame 506, circuit board 508, groove 510, first housing portion 201, second housing portion 207, a battery door 250, and a display lens 252. Insulating frame 506 and circuit board 508 are positioned within interior space 502 formed by first housing portion 201 and second housing portion 207.

Figure 11:
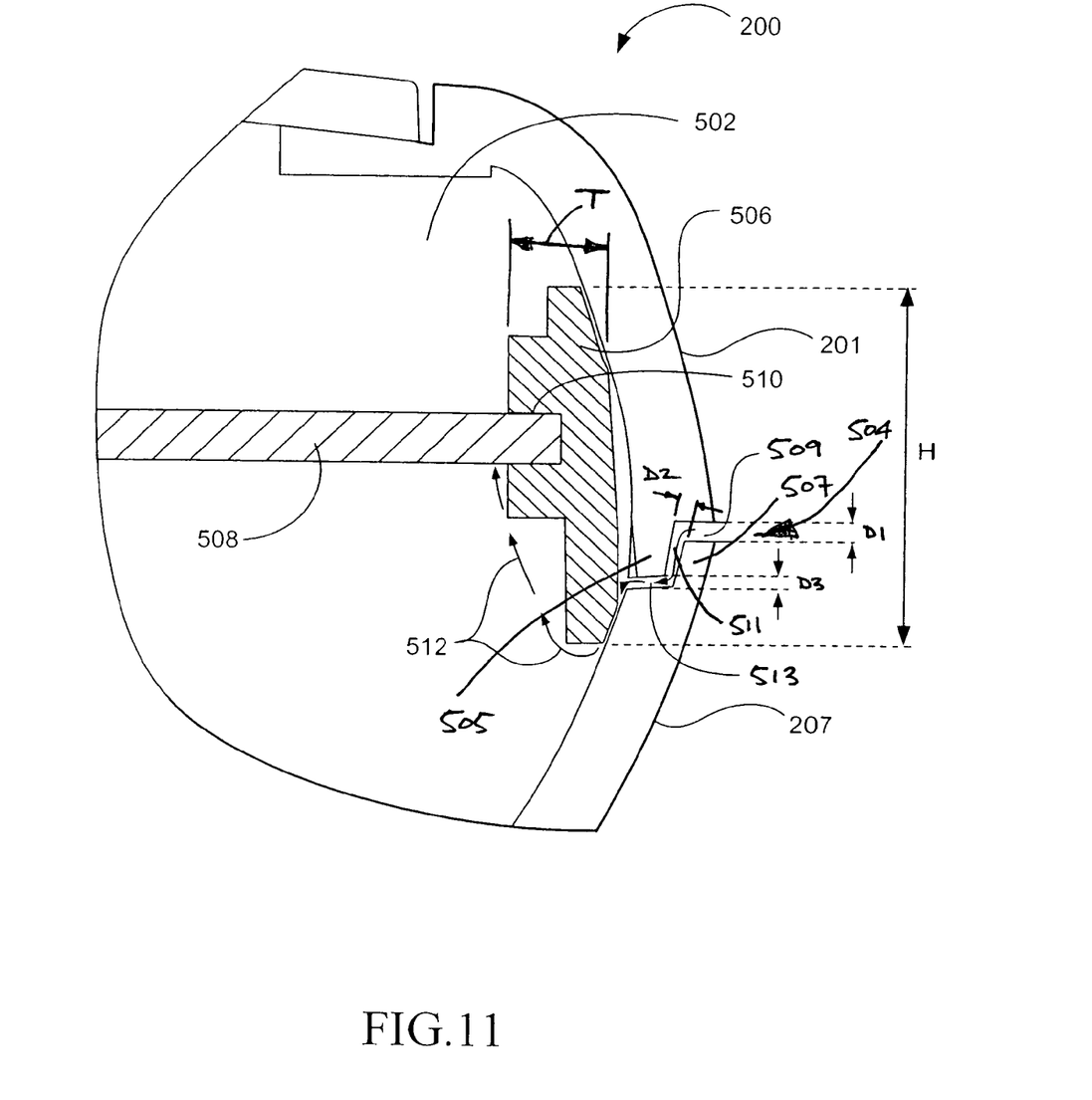
FIG. 11 is a detail view of a portion of the cross-sectional view of the handheld electronic device of FIG. 10.

FIG. 11 shows a portion of the partial cross-sectional view of handheld electronic device 200 identified by reference numeral 550 in FIG. 10. As shown, first housing portion 201 and second housing portion 207 are joined together in such a way as to provide a mating edge connection 504 in the form of a seam around the periphery of handheld electronic device 200. As shown, mating edge connection 504 comprises a substantially continuous seam but depending on the number of housing portions used, for example, may be discontinuous or comprise plural seams or joined edges along any desired portion of the periphery of handheld electronic device 200. Mating edge connection 504 preferably comprises an overlapping connection formed by edge portion 505 of first housing portion 201 and edge portion 507 of second housing portion 207. Any mating edge connection can be used including non-overlapping connections such as a butt-joint or the like, tongue and groove connections and those that otherwise interlock to form a seam. A mating edge connection may comprise hinges, fasteners, or other structural features or devices that generally function to connect plural housing portions together.

Typically, at least some portion of mating edge connection 504 will include an air gap that can potentially provide an air pathway 512 through which a spark can travel from an area outside handheld electronic device 200 to an electronic component inside electronic device 200 such as circuit board 508. For the illustrated overlapping mating edge connection 504, air pathway 512 is at least partially provided by a first gap portion 509 defined by opposing surfaces of the first and second housing portions, 201 and 207, spaced apart by a distance D1. Preferably, mating edge connection 504 is designed so distance D1 is small enough to prevent a finger of a user from penetrating into mating edge connection 504 and discharging a spark. For example, distance D1 preferably ranges from about 0.4 millimeters to about 0.6 millimeters. Air pathway 512 is also at least partially provided by a second gap portion 511 defined by opposing surfaces of the first and second housing portions, 201 and 207, spaced apart by a distance D2. Distance D2 is preferably between about 0.05 millimeters to about 0.15 millimeters. Air pathway 512 is also at least partially provided by a third gap portion 513 defined by opposing surfaces of the first and second housing portions, 201 and 207, spaced apart by a distance D3. Distance D3 is preferably less than distances D1 and D2 and preferably less than about 0.2 millimeters and more preferably less than about 0.05 millimeters.

Referring to FIG. 11, insulating frame 506 is preferably positioned adjacent to mating edge connection 504. The position of insulating frame 506 effectively increases the distance that an electric spark must travel from mating edge connection 504 to circuit board 508. Therefore, the use of insulating frame 506 causes electrostatic discharge protection of circuit board 508 to be increased. That is, insulating frame 506 is positioned within interior space 502 so that it electrically isolates circuit board 508 from electrostatic discharge. The height, H, of insulating frame 506 preferably ranges from about 2 millimeters to about 10 millimeters for the exemplary electronic device 200. The thickness, T, of insulating frame 506 preferably ranges from about 2 millimeters to about 2.5 millimeters.

Further referring to FIG. 10 and particularly the portion identified by reference numeral 551, circuit board 508 is positioned farther away from mating edge connection 504 than in area 550. That is, insulating frame 506 does not physically block second opening 254 as it does in area 550. However, insulating frame 506 still improves electrostatic discharge protection because it sufficiently increases the air pathway from mating edge connection 504 to circuit board 508 around area 551.

Under certain circumstances in which a user has sufficient static build up and contacts electronic device 200 at or near mating edge connection 504, an electric discharge can occur and follow air pathway 512 to circuit board 508 or other electronic component positioned within electronic device 200. Such discharge could potentially cause disruption or damage to one or more electronic components of electronic device 200. Insulating frame 506 functions to reduce the likelihood of electrostatic discharge occurring through mating edge connection 504 by effectively increasing the length of air pathway 512. Preferably, insulating frame 506 is designed to prevent an air discharge event of at least about 8 kV or greater, and preferably at least about 15 kV or greater from disrupting, damaging, or otherwise affecting operation of electronic device 200. Accordingly, insulating frame 506 preferably has a dielectric strength greater than about 20 kV/mm. The dielectric strength of a material is a maximum electric field strength that the material can withstand intrinsically without breaking down (i.e. allowing the electric field to pass through). For example, a material such as Synprene RT-3860M has a dielectric strength of about 22 kV/mm, thus an external electric field will lose 22 kV per mm of travel through the material. Preferably, a path distance through insulating frame 506 is greater than about 1 millimeter on average. Therefore, insulating frame 506 can withstand greater than about a 22 kV electric field before breaking down and allowing a spark to go through it. The dielectric strength of air is 3 kV/mm which is significantly lower than the dielectric strength for a material such as Synprene RT-3860M. Thus, a spark will travel around on an outside portion of insulating frame 506 because the dielectric strength of insulating frame 506 multiplied by a shortest path distance through insulating frame 506 to circuit board 508 is greater than the dielectric strength of air multiplied by a distance of air pathway 512.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

What is claimed is:

1. A handheld electronic device, the device comprising:
a first and second housing portions at least partially defining an enclosure:
a mating edge connection between the first and second housing portions, wherein at least a portion of the mating edge connection comprises a gap between the first housing portion and the second housing portion;
an electronic component positioned within the enclosure; and
an electrically insulating frame positioned within the enclosure and surrounding at least a portion of the electronic component to provide an electrostatic barrier between the mating edge connection and the electronic component and wherein the electrically insulating frame is positioned adjacent to the gap between the first housing portion and the second housing portion.

2. The handheld electronic device of claim 1, wherein at least a portion of the mating edge connection comprises a portion of the first housing position that overlaps with a portion of the second housing portion.

3. The handheld electronic device of claim 1, wherein the electronic component comprises a circuit board.

4. The handheld electronic device of claim 3, wherein the circuit board is at least partially supported by a groove of the electrically insulating frame.

5. A method of protecting an electronic component of an electronic device from an electrostatic discharge, the method comprising the steps of:
surrounding at least a portion of the electronic component with an insulating frame;
at least partially enclosing the electronic component and frame within a housing comprising first and second housing portions and a mating edge connection between the first and second housing portions wherein at least a portion of the mating edge connection comprises a gap between the first housing portion and the second housing portion: and
positioning the frame adjacent to the mating edge connection to provide an electrostatic discharge barrier between the mating edge connection and the electronic component and wherein the electrically insulating frame is positioned adjacent to the gap between the first housing portion and the second housing portion.

6. The method of claim 5, further comprising overlapping an edge portion of the first housing portion with an edge portion of the second housing portion to provide the mating edge connection.

7. The method of claim 5, further comprising supporting the electronic component with the frame.

* * * * *